MOUNTING CHASSIS FOR ELECTRICAL AND ELECTRONIC CIRCUIT ELEMENTS

Filed Nov. 14, 1949 2 SHEETS—SHEET 1

INVENTOR
ADAM E. MILLER
BY G. D. O'Brien
ATTORNEY

INVENTOR
ADAM E. MILLER
BY A. D. O'Brien
ATTORNEY

Patented Jan. 29, 1952 2,583,586

UNITED STATES PATENT OFFICE 2,583,586

MOUNTING CHASSIS FOR ELECTRICAL AND ELECTRONIC CIRCUIT ELEMENTS

Adam E. Miller, Baltimore, Md.

Application November 14, 1949, Serial No. 127,210

12 Claims. (Cl. 175—298)

(Granted under the act of March 3, 1883, as amended April 30, 1928; 370 O. G. 757)

The present invention relates generally to electrical or electronic chassis, and more particularly to a universal chassis which may be employed for mounting any desired type of electrical or electronic circuit elements in any desired relationship.

An object of the present invention is to provide a chassis adapted to mount variously shaped and sized, electrical or electronic circuit elements and providing for the ready mounting such elements into desired arrangement in breadboard fashion, the ready dismounting of such elements, and the ready rearrangement thereof and substitution of different elements upon the chassis.

Another object of the present invention is to provide a universal chassis for mounting the elements of an electrical or electronic circuit without necessitating the preparation of a particular mounting panel for accommodating the particular elements or the particular arrangement of elements desired.

Another object of the present invention is to provide a universal chassis for mounting the various elements of an electrical or electronic circuit which affords an element mounting panel area in which variously sized and shaped elements are rapidly and conveniently mounted and arranged without altering the panel characteristics for accommodating them.

Another object of the present invention is to provide a universal chassis for mounting variously sized and shaped elements which affords an element mounting panel area in which such elements are rapidly and conveniently mounted and arranged without altering the panel characteristics for accommodating them.

Other objects and advantages of the present invention will become apparent to those skilled in the art from a consideration of the following detailed description thereof, made in conjunction with the accompanying drawings, in which like numerals refer to like or corresponding parts and wherein.

Figure 1:
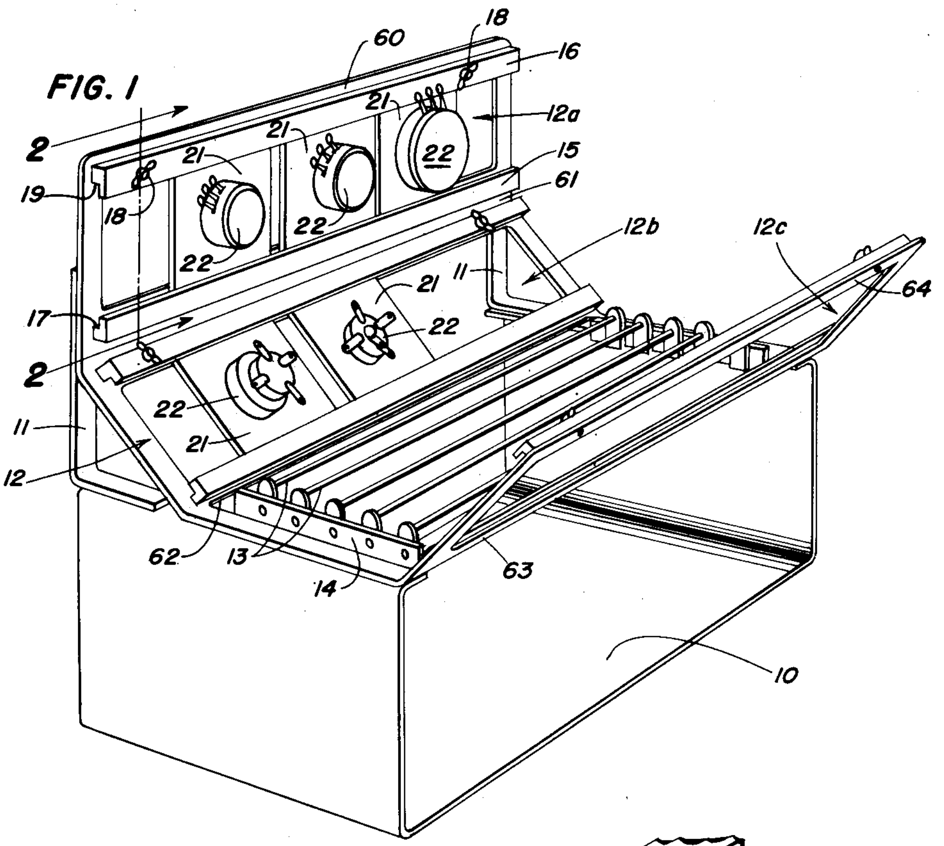
Fig. 1 is a perspective view of a circuit element mounting chassis embodying one form of the present invention.

As illustrated in the generally perspective view of the present invention shown in Fig. 1, the chassis comprises a suitable base 10 formed of any structural supporting material, such as sheet metal, having affixed to the upper portion thereof the L-shaped vertical support standards 11 and the breadboard frame generally indicated by the numeral 12, preferably formed as a stamping of sheet metal or other suitable structural supporting material, to frame the three element mounting panel areas 12a, 12b, and 12c by means of the longitudinal panel area delineating struts 60, 61, 62, 63, and 64. A plurality of bus bars 13 may be provided, which extend across the upper portion of the chassis base or are otherwise located in convenient relationship to the several panel areas, and are supported thereacross by means of the electrically insulating bridges 14. In general, the present invention contemplates the assembly of a plurality of electrical or electronic circuit elements, such as rheostats, radio type potentiometers, vacuum tubes, switches, variable condensers, and the like in the panel areas 12a, 12b, and 12c and the interconnection of the elements to form a desired operative circuit, which may include such circuit elements as resistors and fixed condensers in the connections between the elements so assembled. The provision of the bus bars 13 presents a substantial convenience in connecting the various assembled elements, by presenting conductors conveniently accessible to all portions of each panel area.

It is also within the contemplation of the present invention to provide for the ready and convenient clamping of circuit elements in the panels of the present chassis and to provide for the ready removal, substitution, or interchange of such elements. To this end, the embodiment of the invention shown in Fig. 1, is provided on panel area 12a, for example, with a recessed, element receptacle bar 15 affixed to the strut 61 along the bottom edge of panel area 12a, while the upper edge of this panel area is provided with the recessed, element clamping bar 16, and each of the other panel areas are similarly provided. Referring to the enlarged cross-sectional detailed view of panel area 12a, illustrated in Fig. 2, the recessed receptacle bar 15 is affixed to the frame strut 61, thereby providing the groove 17, which preferably extends the length of the bottom edge of the panel area. The clamping bar 16 is adjustably clamped to the frame strut 60 by means of the flanged wing headed bolt 18 through the transversely extending elongated slot 20 formed therein, and a threaded opening provided in the frame strut 60 for receiving the threaded portion of the bolt. It is preferable that two or more such clamping bolts 18 be provided, one at each end of the bar 16. The clamping bar is formed with a longitudinal recess which cooperates with the frame strut 60 to provide the groove 19 extending preferably the length of the upper edge of the panel area. Thus, the panel area 12a is provided with the groove 17 along its bottom edge and with a corresponding groove 19 along its upper edge, and the clamping bar 16 may be lifted or lowered through the provision of the elongated slots 20 when the bolts 18 are loose, and may be clamped in position by the tightening of the bolts. The other panel areas 12*b* and 12*c* are similarly provided with upper and lower edge grooves and adjustable clamping bars.

Figure 2:
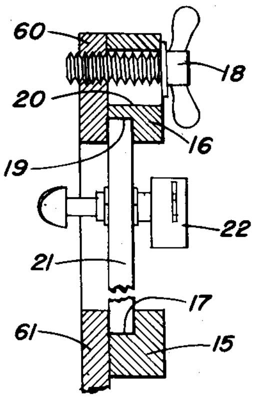
Fig. 2 is an enlarged cross-sectional view of a portion of Fig. 1 taken along the line 2—2, showing the element mounting means.

To facilitate the ready mounting, dismounting, or interchange of electrical or electronic circuit elements upon the present chassis, the various elements employed, such as rheostat, radio type potentiometers, variable condensers, switches, vacuum tube base receptacles, and the like, as are generally denoted in the drawings by the reference numeral 22, are all mounted upon separate plates 21. These mounting plates are of such dimensions and so designed as to enable ready positioning thereof in any one of the several panel areas of the present chassis. The mounting of these plates in the panel areas of the embodiment shown in Figs. 1 and 2 is accomplished by inserting the lower edge of the plate in the groove 17, lifting the clamping bar with the bolts 18 loose, laying the upper edge of the plate against the frame strut 60, lowering the clamping bar so as to place the upper edge of the plate in the groove 19, and then tightening the bolts 18 to clamp the plate in position. In this manner, any desired number of circuit element carrying mounting plates 21 may be readily assembled in breadboard fashion in any desired arrangement in the several panel areas of the present chassis, and may be equally readily removed from the chassis, or other element carrying plates may be added to, interchanged with or substituted for those already positioned thereon. By mounting a large number and variety of circuit elements of varying characteristics upon separate plates 21, the same chassis may be employed for assembling in breadboard fashion the elements of any number of different types of circuits, the bus bars 13 providing conveniently accessible conductors for connecting the different elements of the circuit, and if desired, additional elements such as fixed resistors and fixed condensers may be interposed in the connections between the various elements. Also, the present invention enables the quick and ready rearrangement of elements assembled upon the several panels when desired. Thus, whereas in the conventional breadboard type assembly of circuit elements it is necessary to provide mounting holes upon the mounting board of the proper size and in the proper position for the particular elements and assembly of elements intended to be employed, the present invention provides a permanent universal chassis for breadboard type assemblies of electrical and electronic circuit elements which may be employed for the assembly of substantially all types of circuit elements and substantially all types of element assemblies, it being necessary when employing the present chassis to merely select the desired elements already mounted upon plates and to insert them in any desired arrangement upon the several panels of the chassis. Thus only one chassis is needed for any type of breadboard assembly, avoiding the necessity for providing a different mounting board for each circuit desired.

Figure 3:
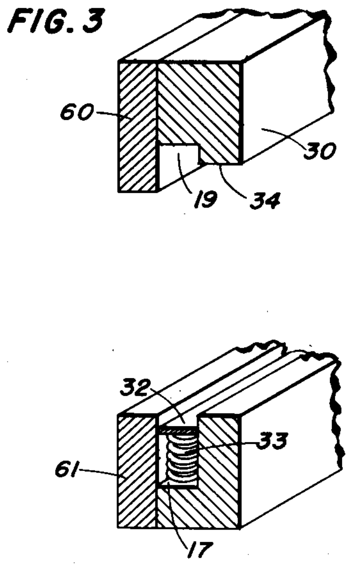
Figs. 3 and 4 are detailed views of a modification of the element mounting means.
Figure 4:
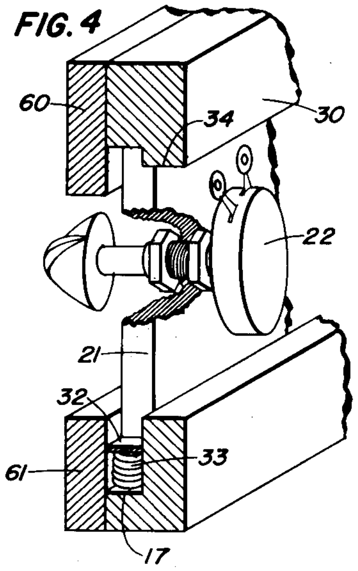

Figs. 3 and 4 illustrate a modification of the present invention, showing a resilient means for clamping the circuit element carrying mounting plates 21 in the panel areas 12*a*, 12*b*, and 12*c* of the chassis. In this embodiment, in place of the clamping bar 16, each of the panels may be provided along its upper edge with a fixed groove forming recessed bar 30 cooperating with the respective frame struts 60, 61, and 64, which form the upper edges of the panel areas, to provide the upper longitudinal groove 19 for each panel area, while the groove 17 formed along the bottom edge of each panel area as in the first described embodiment is fitted with the false bottom plate 32 resiliently supported by springs 33, one of which is shown in the drawing. To position a circuit element carrying mounting plate 21 in a panel area of this embodiment, the bottom of the mounting plate is first inserted in the groove 17 to depress the false bottom plate 32 against the compression of its supporting springs 33 until the upper edge of the mounting plate clears the lip 34 of the upper groove 19, whereupon the upper edge of the mounting plate 21 is guided into the upper slot 19 to be raised therein and there frictionally held in position by the pressure exerted by the compressed springs 33. In the present embodiment as in that described above, any number of circuit elements may be mounted in each panel area, the number being limited only by the size of the plates 21 and the length of the panel areas.

Figures 5, 6:
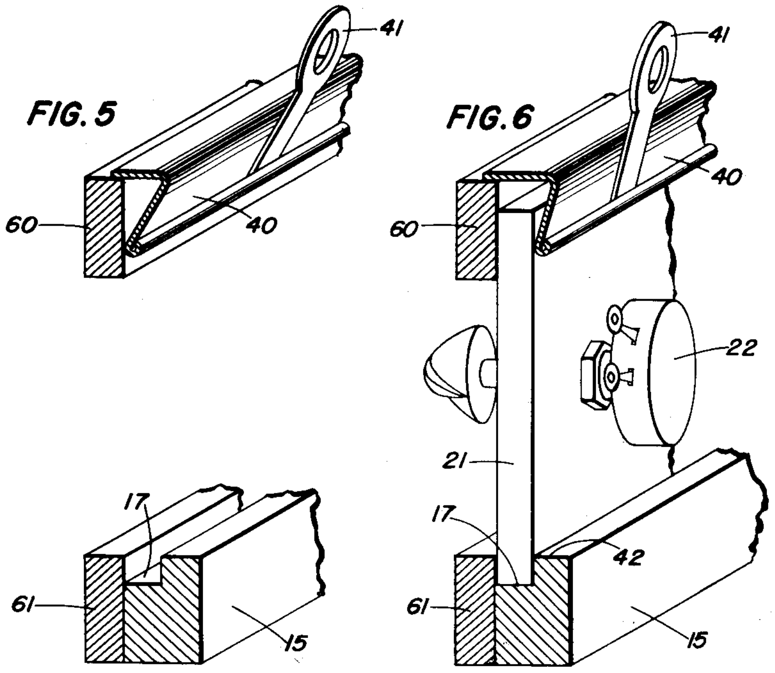
Figs. 5 and 6 are detailed views of another modification of the element mounting means.

In accordance with another modification of the present invention, a third means for positioning the circuit element carrying mounting plates 21 in the panel areas of the chassis is illustrated in Figs. 5 and 6. In this embodiment, the frame struts 61, 62, and 63, which form the bottom edges of each of the panel areas, have groove forming bars 15 affixed thereto to form a groove 17 along the bottom edge of each panel area, while the frame struts 60, 61, and 64, which form the upper edges of the panel areas, are each provided with a spring clip 40 suitably affixed thereto and formed, for example, of sheet spring metal. A finger grip 41 is also provided to permit opening of the clip away from the frame strut. In positioning a circuit element carrying mounting plate 21 in a panel area, the spring clip 40 is opened to enable the upper edge of the plate to be inserted therein until the bottom edge of the plate clears the lip 42 of slot 17, whereupon the bottom edge of the mounting plate is inserted into the slots 17 and the spring clip 40 released to clamp the plate and the circuit element carried thereby in position.

Figure 7:
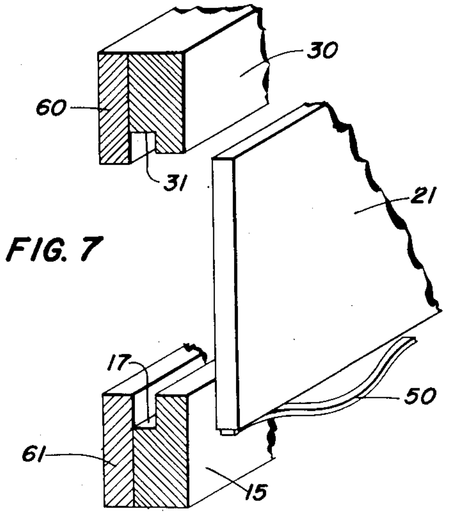
Fig. 7 is a detailed view of still another modification of the element mounting means.

Fig. 7 illustrates another modification of the present invention, providing still another means for holding the element carrying plates in position in the panel areas. In this modification each panel area is provided with longitudinal grooves 31 and 17 along its upper and lower edges, while the plate is provided with a flat spring 50 affixed to its upper or lower edge. To mount the plate in the panel area, the spring carrying edge is inserted in one groove and depressed therein against the action of the spring until the opposite edge thereof clears the lip of the other groove, whereupon the plate is guided into the latter groove and is held in position by the action of the spring 50.

Thus, there is provided a universal chassis for assembling experimental electrical or electronic circuits in a breadboard fashion, which enables the ready assembly of many different types of circuits upon a single chassis, provides for the ready disassembly of such circuits so assembled, and further provides for the ready interchange or rearrangement of elements so assembled.

Other modifications of the present invention than those specifically described hereinabove but within the spirit and scope thereof as defined by the appended claims will be apparent to those skilled in the art.

The invention described herein may be manufactured and used by or for the Government of the United States of America for governmental purposes without the payment of any royalties thereon or therefor.

What is claimed is:

1. A mounting chassis for a plurality of electrical or electronic circuit elements comprising a frame formed to delineate a circuit element mounting area, said frame having a groove formed along one area delineating edge thereof, a readily fastened and unfastened clamping means extending along another area delineating edge of said frame, an individual mounting plate for each of the elements, said plates being each adapted to have individual elements removably secured thereto, to be mounted in said groove, and to be fixed in position on said frame by said clamping means, and electrically conducting bus bars carried by said frame to provide ready electrical interconnection between circuit elements thus mounted, thereby providing a permanent means for assembling varying types of circuits in breadboard fashion enabling a ready mounting, dismounting, arrangement, rearrangement, and interchange of individual circuit elements of various shapes and sizes upon said frame and a changing of elements secured to said plates.

2. A mounting chassis for a plurality of electrical or electronic circuit elements comprising a frame formed to delineate a circuit element mounting area, an individual mounting plate for each of the elements, these plates being designed to be carried by said frame in said area and each being adapted to have an individual circuit element removably secured thereto, and clamping means extending along one area delineating edge of said frame for readily fastening in and unfastening from position plates carried by said frame, thereby providing a permanent means for assembling the individual elements of varying types of circuits enabling a ready mounting, dismounting, arrangement, rearrangement, and interchange of individual circuit elements of various shapes and sizes upon said frame, enabling desired relative spacing of elements so mounted, and enabling a changing of elements secured to said plates.

3. A mounting chassis for a plurality of electrical or electronic circuit elements comprising a frame formed to delineate a circuit element mounting area, an individual mounting plate for each of the elements, these plates being designed to be carried by said frame in said area and each being adapted to have an individual circuit element secured thereto, and clamping means for fixing in position plates carried by said frame, thereby providing a permanent means for assembling the individual elements of varying types of circuits enabling a ready mounting, dismounting, arrangement, rearrangement, and interchange of individual circuit elements of various shapes and sizes upon said frame and enabling desired relative spacing of elements so mounted.

4. A mounting chassis for a plurality of electrical or electronic circuit elements comprising a frame formed to delineate a circuit element mounting area, an individual mounting means for each of the elements, said means being designed to be carried by said frame in said area and each being adapted to have an individual circuit element secured thereto, and clamping means for the ready fixing in and removal from position of individual mounting means carried by said frame, thereby providing a permanent means for assembling the individual elements of varying types of circuits enabling a ready mounting, dismounting, arrangement, rearrangement, and interchange of individual circuit elements of various shapes and sizes upon said frame and enabling desired relative spacing of elements so mounted.

5. A device as set forth in claim 2 with said clamping means comprising a clamping bar extending along said area delineating edge of said frame and adjustable means for urging said bar against plates carried by said frame to clamp them between said bar and frame.

6. A device as set forth in claim 4 with said clamping means comprising a clamping bar extending along a mounting area delineating edge of said frame and means for urging said bar against plates carried by said frame to clamp them between said bar and frame.

7. A device as set forth in claim 2 with said clamping means comprising a resilient clip extending along said area delineating edge of said frame for clamping thereto the plates carried by the frame.

8. A device as set forth in claim 4 with said clamping means comprising a resilient clip extending along a mounting area delineating edge of said frame for clamping thereto the plates carried by the frame.

9. A device as set forth in claim 2 with said clamping means comprising a resilient means extending along said area delineating edge of said frame for urging plates carried by said frame into frictional engagement with the opposite area delineating edge of said frame.

10. A device as set forth in claim 4 with said clamping means comprising a resilient means extending along a mounting area delineating edge of said frame for urging plates carried by said frame into frictional engagement with another mounting area delineating edge of said frame.

11. A device as set forth in claim 3 with said clamping means comprising resilient means carried by said frame into frictional engagement with a mounting area delineating edge of said frame.

12. A device as set forth in claim 4 with said clamping means comprising resilient means carried by said mounting means for urging the mounting means carried by said frame into frictional engagement with a mounting area delineating edge of said frame.

ADAM E. MILLER.

REFERENCES CITED

The following references are of record in the file of this patent:

UNITED STATES PATENTS

| Number | Name | Date |
|---|---|---|
| 655,739 | Runtz | Aug. 14, 1900 |
| 1,401,736 | Rothschild | Dec. 27, 1921 |
| 1,510,845 | Haywood | Oct. 7, 1924 |
| 1,612,952 | Stevenson | Jan. 4, 1927 |
| 1,809,025 | Cruser | June 9, 1931 |
| 1,817,034 | Hotchkin | Aug. 4, 1931 |
| 2,372,083 | Johansson | Mar. 20, 1945 |